United States Patent
Orimoto et al.

[11] Patent Number: 5,850,231
[45] Date of Patent: Dec. 15, 1998

[54] ELECTRONIC DEVICE HAVING FERROELECTRIC MEMORY

[75] Inventors: Takashi Orimoto, Tokyo; Ryo Ishikawa, Saitama-ken; Shigeto Suzuki, Tokyo; Katsuyoshi Kaneko, Tokyo; Takashi Shirasaka, Tokyo, all of Japan

[73] Assignee: Casio Computer Co., Ltd., Tokyo, Japan

[21] Appl. No.: 650,647

[22] Filed: May 13, 1996

Related U.S. Application Data

[63] Continuation of Ser. No. 224,436, Apr. 8, 1994, abandoned.

[30] Foreign Application Priority Data

Apr. 13, 1993 [JP] Japan .................................. 5-086441

[51] Int. Cl.[6] ...................................................... G09G 5/04
[52] U.S. Cl. ........................................... 345/507; 345/211
[58] Field of Search ..................................... 345/185, 201, 345/202, 203, 507, 509, 515; 365/145, 154

[56] References Cited

U.S. PATENT DOCUMENTS

| | | | |
|---|---|---|---|
| 5,060,191 | 10/1991 | Nagasaki et al. | 365/145 |
| 5,077,612 | 12/1991 | Megrgardt et al. | 365/154 |
| 5,198,384 | 3/1993 | Dennison | 365/145 |
| 5,270,967 | 12/1993 | Moazzami et al. | 365/145 |
| 5,297,077 | 3/1994 | Imai et al. | 369/145 |
| 5,307,304 | 4/1994 | Saito et al. | 365/145 |

FOREIGN PATENT DOCUMENTS

| | | |
|---|---|---|
| A-0 530 928 | 3/1993 | European Pat. Off. . |
| 41 19 248 A1 | 1/1992 | Germany . |

*Primary Examiner*—Chanh Nguyen
*Attorney, Agent, or Firm*—Frishauf, Holtz, Goodman, Langer & Chick

[57] ABSTRACT

An electronic device maintains data utilizing a ferroelectric memory, not requiring a backup power source voltage. Data such as schedule data and telephone number data is stored in a ferroelectric RAM which switches between a dynamic mode and a nonvolatile mode. When a clock mode is designated by a "CLK" key, a memory control circuit causes the ferroelectric RAM to be switched to the nonvolatile mode to maintain the data stored therein. When a schedule mode or a telephone mode is designated by means of a "Sch" key or a "Tel" key, the ferroelectric RAM is switched to the nonvolatile mode to write/read data therein/therefrom. When it is detected that a battery voltage is lowered or the battery is removed from the electronic device, the ferroelectric RAM is switched to the nonvolatile mode to protect the stored data.

9 Claims, 7 Drawing Sheets

ELECTRONIC DEVICE HAVING FERROELECTRIC MEMORY

This application is a Continuation of application Ser. No. 08/224,436, filed Apr. 8, 1994, now abandoned.

BACKGROUND OF THE INVENTION

1. Field of the Invention

The present invention relates to an electronic device having a ferroelectric memory which can switch between a dynamic mode and a nonvolatile mode, and more particularly to a mode switch control in the memory.

2. Description of the Related Art

Conventionally, notebooks have been widely used to memorize personal schedules, and the addresses and telephone numbers of acquaintances. However, recently, so-called electronic notebooks have been put into practical use. An electronic notebook stores data in a semiconductor memory by means of key-input operation and reads data from the memory, and can display it on a display section, if necessary.

In the electronic notebook, data is stored in a RAM such as a DRAM (dynamic RAM) or a SRAM (static RAM), which is incorporated in the electronic notebook or in a card serving as an external memory medium. A backup voltage is supplied to the RAM to maintain the stored data, even if the power source is turned off or the card is removed from the electronic notebook. A cell or a battery is generally used as the power source for an electronic device of this type. Therefore, if the cell or battery is consumed over a long period of time, the backup voltage cannot be supplied to the RAM and the data in the RAM will be lost. To prevent this, some conventional electronic devices have an alarm function for informing the user, by means of the display or the buzzer, that the cell or battery needs to be exchanged, when the power source voltage is reduced below a predetermined level.

However, even in an electronic device with the cell or battery exchange alarm function, if the device is not used for a long period of time, the user will not be aware of the alarm and the power will continue to be consumed. In this case, data in the RAM will be lost, despite the alarm function.

In recent years, new memories have been developed. One of them is a ferroelectric memory, which has not only a reading/writing characteristic equivalent to that of a normal semiconductor RAM but also a nonvolatile characteristic.

The ferroelectric memory operates in a dynamic mode or a nonvolatile mode: in the former, the memory operates as a normal DRAM; and in the latter, it operates as a nonvolatile memory. More specifically, in a dynamic mode operation, the memory is used as a DRAM capacitor cell due to its high dielectric constant obtained by a special memory structure. In nonvolatile mode operation, data can be maintained without a power source owing to a stable state due to its polarization.

SUMMARY OF THE INVENTION

An object of the present invention is to provide an electronic device which stores data in a ferroelectric memory, without a backup power source.

Another object of the present invention is to provide a device for accurately controlling the modes of a ferroelectric memory used in an electronic device.

According to an aspect of the present invention, there is provided an electronic device comprising:

a ferroelectric memory which switches between a dynamic mode and a nonvolatile mode;

state managing means for managing a state of the electronic device; and mode designating means for designating one of the modes of the ferroelectric memory in accordance with the state of the electronic device managed by the state managing means.

According to another aspect of the present invention, there is provided an electronic device comprising:

input means for inputting/outputting data;

a ferroelectric memory, which switches between a dynamic mode and a nonvolatile mode, for storing the data input through the input means;

a battery for generating a power for driving the electronic device;

monitoring means for monitoring a state of the battery; and switching means for switching the ferroelectric memory from the dynamic mode to the nonvolatile mode, based on the state of the battery monitored by the monitoring means.

According to still another aspect of the present invention, there is provided an information memory system comprising an external memory medium and an electronic device, to which the external memory medium is removably connected and which writes/reads data to/from the external memory medium, the external memory medium including a ferroelectric memory which switches between a dynamic mode and a nonvolatile mode, and the electronic device including control means for outputting a signal for switch-controlling the dynamic mode and the nonvolatile mode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a timing chart illustrating a mode switching operation at a time when a ferroelectric RAM incorporated in the electronic circuit shown in FIG. 6 is turned on;

DETAILED DESCRIPTION OF THE PREFERRED EMBODIMENTS

[First Embodiment]

Figure 1:
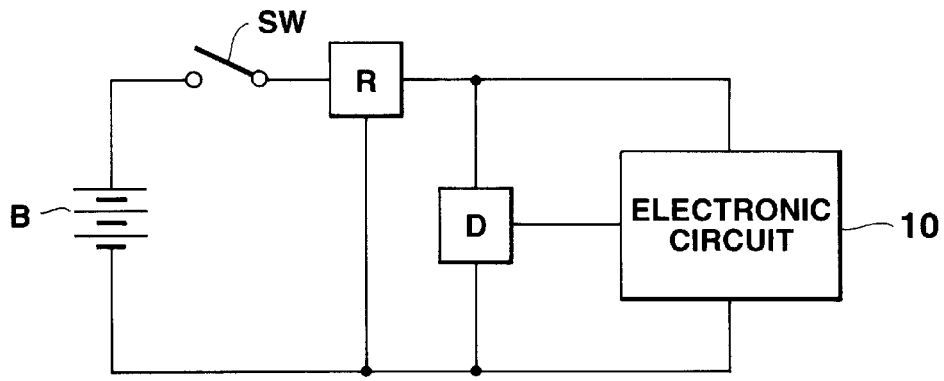
FIG. 1 is a circuit diagram showing a power supplying structure of an electronic device according to a first embodiment of the present invention.

FIG. 1 is a circuit diagram showing a power supplying circuitry for an electronic circuit, in which a nonvolatile ferroelectric memory is switched between a dynamic mode and a nonvolatile mode in association with operations of detecting a source voltage and setting the mode of the device.

The source voltage is supplied from a battery source B constituting a cell or a battery to an electronic circuit 10, i.e., a main part of the electronic device such as an electronic notebook, through a power switch SW and a constant voltage regulator R. An output voltage of the constant voltage regulator R is detected by a voltage detector D which outputs a voltage detection signal to be supplied to the electronic circuit 10.

Figure 2:
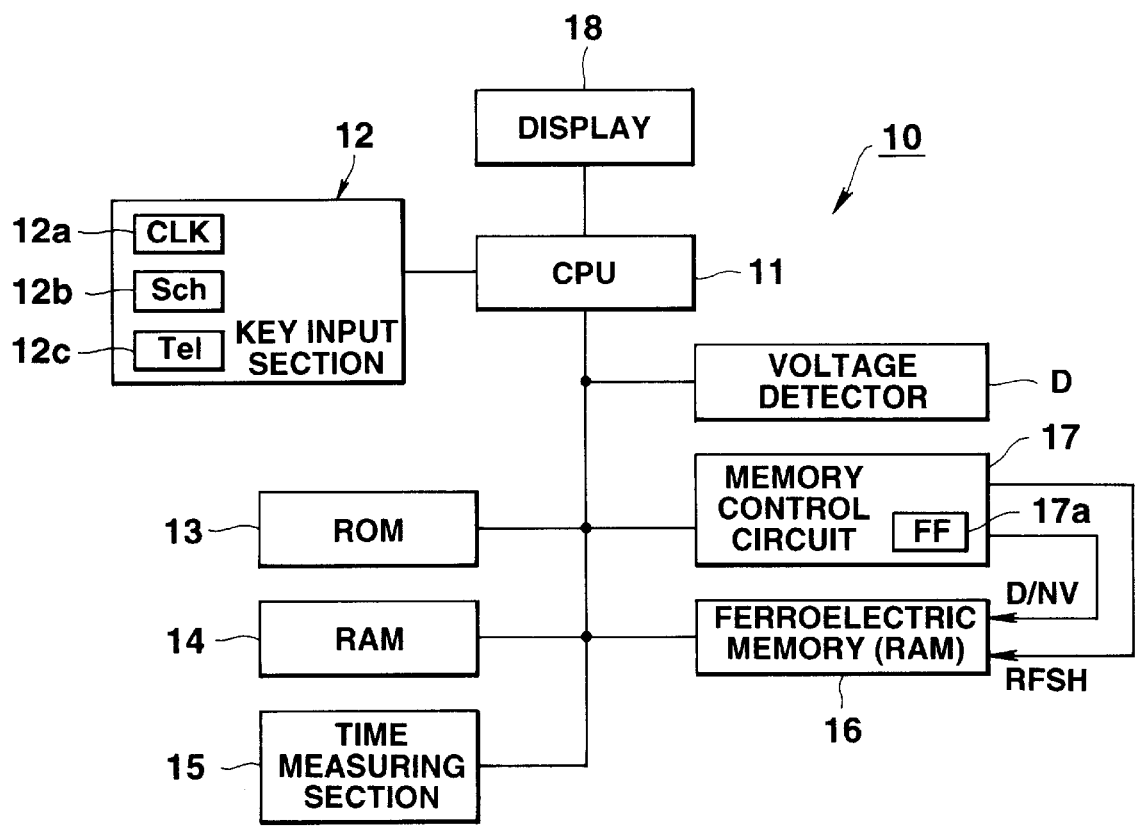
FIG. 2 is a block diagram showing a detailed structure of the electronic circuit of the electronic device shown in FIG. 1.

FIG. 2 is a block diagram showing the electronic circuit 10 of the electronic device.

In the electronic circuit 10, a CPU (central processing unit) 11 activates a system program prestored in a ROM 13 in response to a key operation signal supplied from a key input section 12, so that the operation of each section of the circuit 10 can be controlled. The CPU 11 is connected to the key input section 12, the ROM 13 and the voltage detector D. It is also connected to a RAM 14 operating as a working memory, a time measuring section 15, a ferroelectric memory (ferroelectric RAM) 16, a memory control circuit 17 and a display 18.

The key input section 12 comprises various keys (not shown), such as letter keys, numeric keys and symbol keys, which are used to input personal schedule data or data on the addresses and telephone numbers of acquaintances. It also comprises a "CLK" key 12a which is operated to set the device 10 in a clock mode for displaying a time, an "Sch" key 12b which is operated to set the device 10 in a schedule mode for recording or displaying schedule data, and a "Tel" key 12c which is operated to set the device in a telephone mode for recording and displaying phone number data.

The ferroelectric RAM 16 switches between a volatile mode (dynamic mode) in which it operates as a normal DRAM and a nonvolatile mode in which no backup voltage is required. The ferroelectric RAM 16 stores, as record data, the schedule data or telephone number data which have been input in the schedule mode and the telephone mode.

Control signals, such as a mode switching signal D/NV for switching between the dynamic mode and the nonvolatile mode and a refreshing signal RFSH, are supplied from the memory control circuit 17 to the ferroelectric RAM 16 in response to the instructions from the CPU 11.

The memory control circuit 17 outputs a mode switching signal D/NV through a flip-flop (FF) 17a incorporated therein. When the signal D/NV is "1", the ferroelectric RAM 16 is set to the dynamic mode and when the signal D/NV is "0", the RAM 16 is set to the nonvolatile mode.

Figure 3:
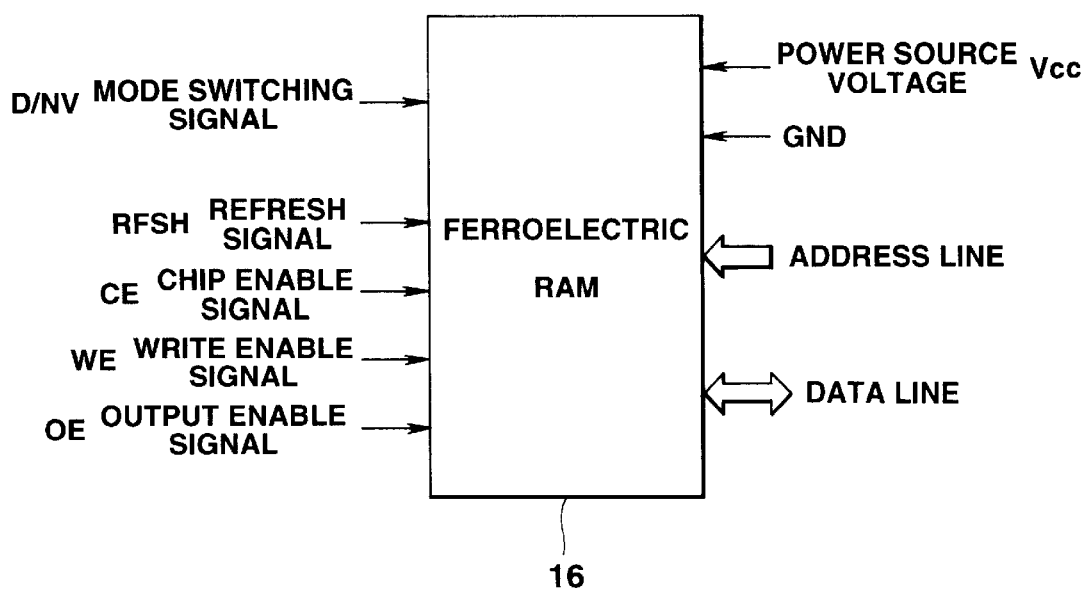
FIG. 3 is a diagram showing a terminal structure of a ferroelectric RAM incorporated in the electronic circuit shown in FIG. 2.

FIG. 3 is a diagram showing the terminal structure of the ferroelectric RAM 16 incorporated in the electronic circuit 10.

The ferroelectric RAM 16 comprises a source terminal $V_{cc}$, a ground terminal GND and connection terminals connected to address and data lines. It also comprises control signal input terminals for receiving a mode switching signal D/NV, a refresh signal RFSH, a chip enable signal CE, a write enable signal "WE" and an output enable signal OE.

Figure 4:
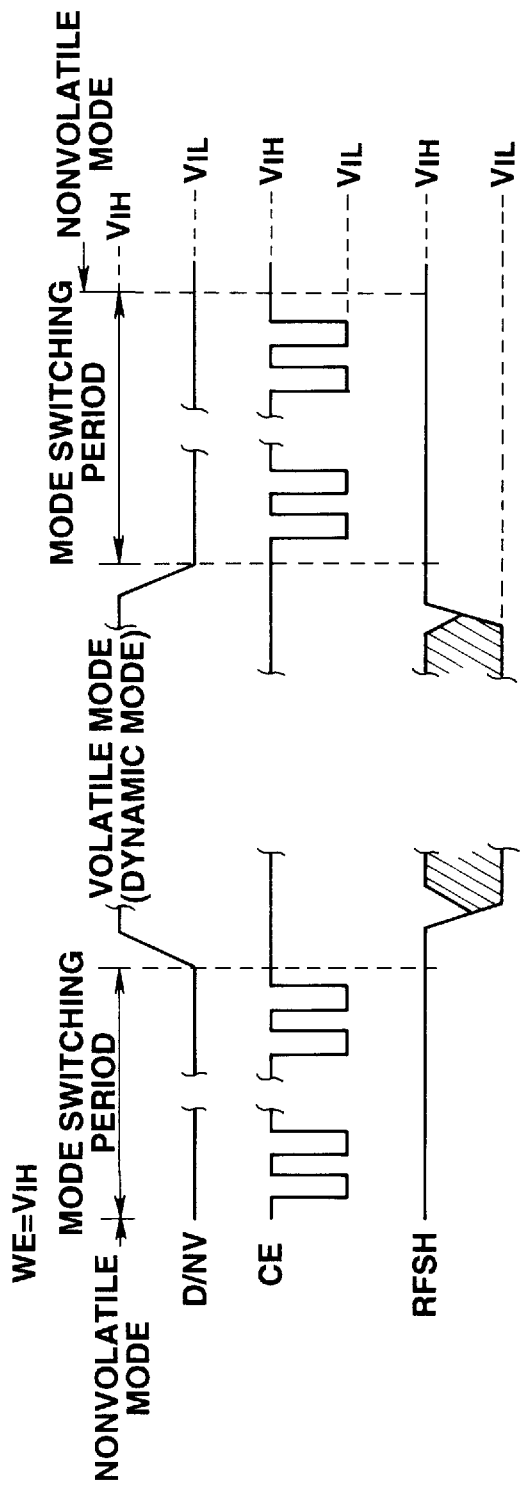
FIG. 4 is a timing chart illustrating a mode switching operation of the ferroelectric RAM incorporated in the electronic circuit shown in FIG. 2.

FIG. 4 is a timing chart showing a mode switching operation of the ferroelectric RAM 16 incorporated in the electronic circuit 10.

When a chip enable (pulse) signal CE is supplied to the ferroelectric RAM 16 for a predetermined period of time in the nonvolatile mode and the mode switching signal D/NV is changed from "0" ($V_{IL}$) to "1" ($V_{IH}$) at the end of the mode switching period, the ferroelectric RAM 16 is switched to the dynamic mode, in which a refresh signal RFSH is supplied. In the dynamic mode, when the supply of the refresh signal RFSH is stopped, the mode switching signal D/NV is changed from "1" ($V_{IH}$) to "0" ($V_{IL}$) and a chip enable (pulse) signal CE is supplied to the ferroelectric RAM 16 for a predetermined period of time, then the ferroelectric RAM 16 is switched to the nonvolatile mode after the mode switching period.

Figure 5:
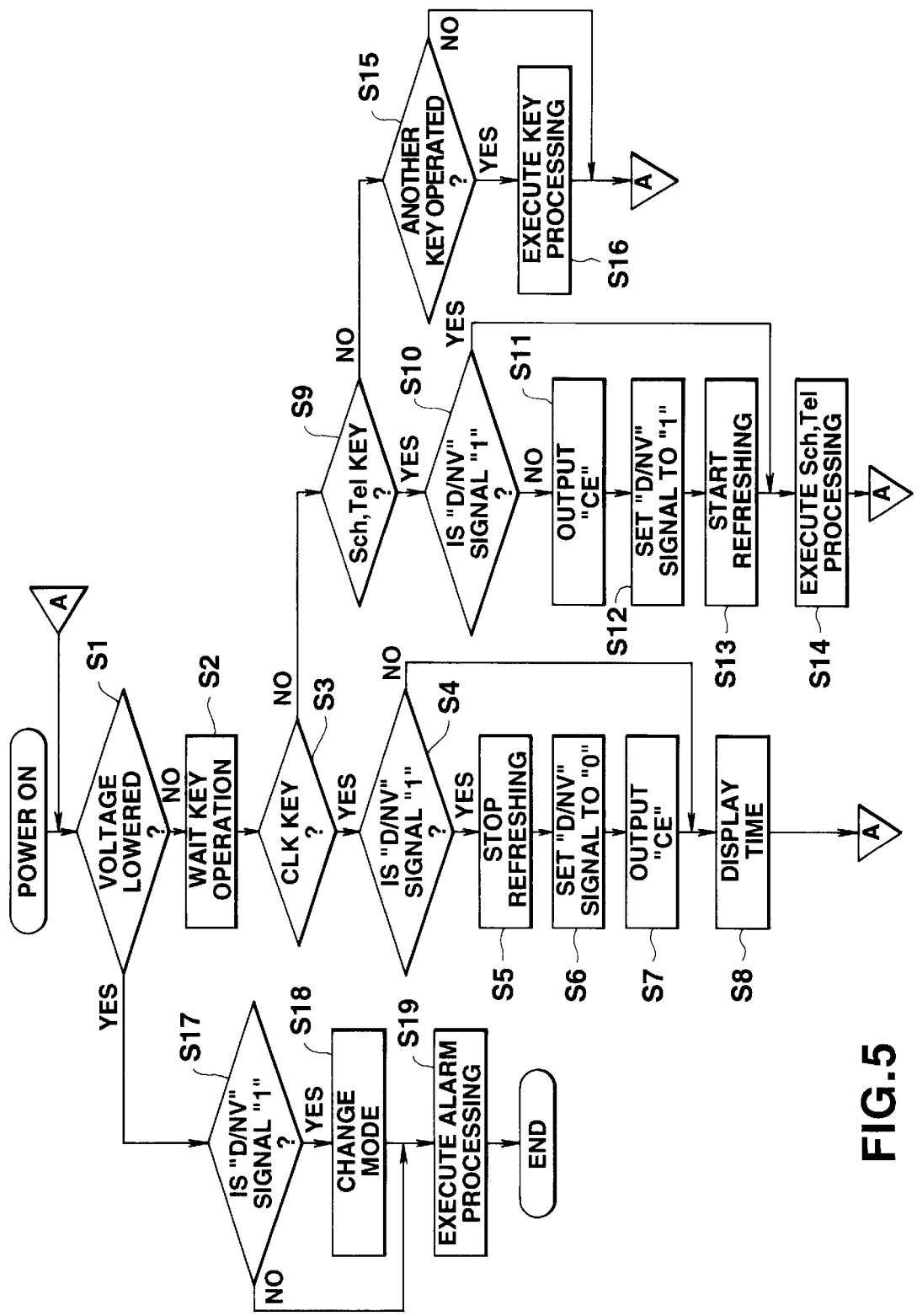
FIG. 5 is a flowchart illustrating an operation of the electronic device according to the first embodiment of the present invention.

An operation of the above-described electronic device will now be described with reference to the flowchart shown in FIG. 5.

When the power switch SW (shown in FIG. 1) is turned on, the CPU 11 determines, based on the voltage detection signal from the voltage detector D, whether the source voltage of the battery B supplied to the electronic circuit 10 is lowered to a predetermined level, which is necessary for the operation (step S1).

If it is determined that the source voltage is not lowered to the predetermined level in step S1 ("NO"), the electronic device waits for a key operation signal supplied from the key input section 12 (step S1→step S2).

Clock Mode

When the user set the clock mode by operating the "CLK" key 12a of the key input section 12, the CPU 11 determines whether the mode switching signal D/NV generated from the flip-flop 17a of the memory control circuit 17 is "1" or not, i.e., whether the current operation mode of the ferroelectric RAM 16 is the dynamic mode or not (step S3→step S4). If the CPU 11 determines that the current operation mode is the dynamic mode, the memory control circuit 17 stops supplying of the refresh signal RFSH, changes the mode switching signal D/NV from "1" ($v_{IH}$) to "0" ($V_{IL}$), and causes the chip enable signal CE to be supplied to the ferroelectric RAM 16 for a predetermined period of time. Thus, the RAM 16 is switched to the nonvolatile mode (steps S5, S6 and S7).

Based on time data from the time measuring section 15, the display 18 displays the time (step S8).

In the clock mode, since data is not written in (recorded) or read from the ferroelectric RAM 16 (displayed), the ferroelectric RAM 16 is changed to the nonvolatile mode, so as to avoid waste of power.

If the CPU 11 determines that the current operation mode is the nonvolatile mode, steps S5 to S7 are passed and the flow advances to the time display step (step S8).

Schedule Mode and Telephone Mode

In the waiting state in step S2, if the user sets the schedule mode or the telephone mode by operating the "Sch" key 12*b* or the "Tel" key 12*c* of the key input section 12, the CPU 11 determines whether the mode switching signal D/NV supplied from the memory control circuit 17 is "1" or not, i.e., whether the current operation mode of the ferroelectric RAM 16 is the dynamic mode or not (step S9→step S10). If the CPU 11 determines that the current operation mode is not the dynamic mode, the memory control circuit 17 causes the chip enable signal CE to be supplied to the ferroelectric RAM 16 for a predetermined period of time, changes the mode switching signal D/NV from "0" ($V_{IL}$) to "1" ($V_{IH}$), and starts supplying the refresh signal RFSH. Thus, the ferroelectric RAM 16 is switched to the dynamic mode (steps S11, S12 and S13).

In this state, schedule data or telephone number data can be written in or read from the ferroelectric RAM 16 in accordance with the key input operation and the recording or displaying process can be executed (step S14).

In the schedule mode or telephone mode, since the data is written in (recorded) or read from the ferroelectric RAM 16 (displayed), the RAM 16 is switched to the dynamic mode, in which it operates as a DRAM.

If the CPU 11 determines that the current operation mode is the dynamic mode in step S10, steps S11 to S13 are passed and the flow advances to the schedule or telephone processing step (step S14).

Low Voltage State

If it is determined that the source voltage is lowered to the predetermined level or lower in step S1, the CPU 11 determines whether the mode switching signal D/NV set in the memory control circuit 17 is "1" or not, i.e., whether the current operation mode of the ferroelectric RAM 16 is the dynamic mode or not (step S1→step S17). If the CPU 11 determines that the current operation mode is the dynamic mode, the memory control circuit 17 stops supplying the refresh signal RFSH, changes the mode switching signal D/NV from "1" ($V_{IH}$) to "0" ($V_{IL}$), and causes the chip enable signal CE to be supplied to the ferroelectric RAM 16 for a predetermined period of time. Thus, the ferroelectric RAM 16 is switched to the nonvolatile mode (step S18).

If it is determined that the current operation mode is the nonvolatile mode in step S17, the mode is maintained.

Then, an alarm process, for informing the user that the battery B needs to be exchanged, is performed by displaying a message or driving a buzzer (step S19).

In summary, when the remaining power in the battery B becomes so little that the data stored in the ferroelectric RAM 16 in the dynamic mode may be damaged or lost, the RAM 16 is switched to the nonvolatile mode.

Thus, in the electronic device as described above, when the clock mode is selected or the voltage detector D detects a source voltage lower than a predetermined level, the ferroelectric RAM 16 is switched by the memory control circuit 17 to the nonvolatile mode in order to maintain the stored data. When the schedule mode or the telephone mode is selected, the ferroelectric RAM 16 is switched to the dynamic mode to execute data writing (recording) or reading (displaying). In this manner, since power is consumed only when the data memory needs to be accessed, the lifetime of the battery B can be prolonged.

[Second Embodiment]

Figure 6:
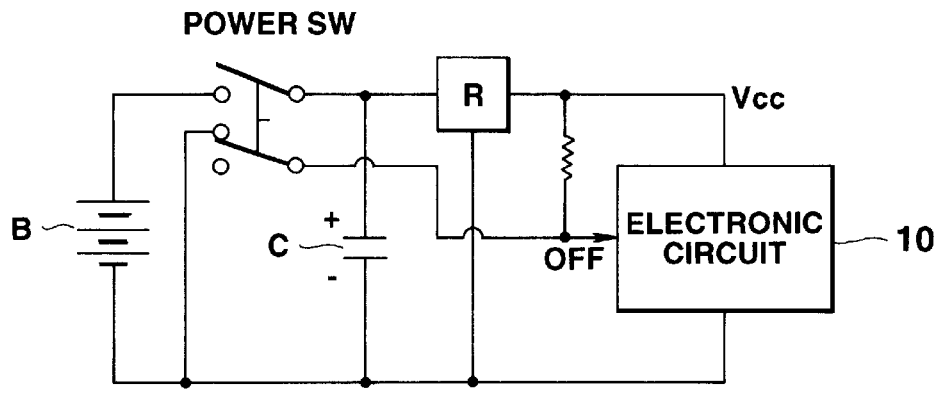
FIG. 6 is a circuit diagram showing a power supplying structure of an electronic device according to a second embodiment of the present invention.

FIG. 6 is a circuit diagram showing a power supplying circuitry of an electronic device, in which the mode of the ferroelectric RAM is switched in association with the power switch SW.

A source voltage is supplied from a power source B constituting a cell or a battery to an electronic circuit 10 through the power switch SW and a constant voltage regulator R.

A capacitor C is inserted in a stage subsequent to the power switch SW and accumulates the source voltage when the power source is in an ON state. When the power switch SW is in an OFF state, a power source OFF signal "0" ($V_{IL}$) is supplied to the electronic circuit 10. The electronic circuit 10 has the same configuration as in the first embodiment.

Figure 7:
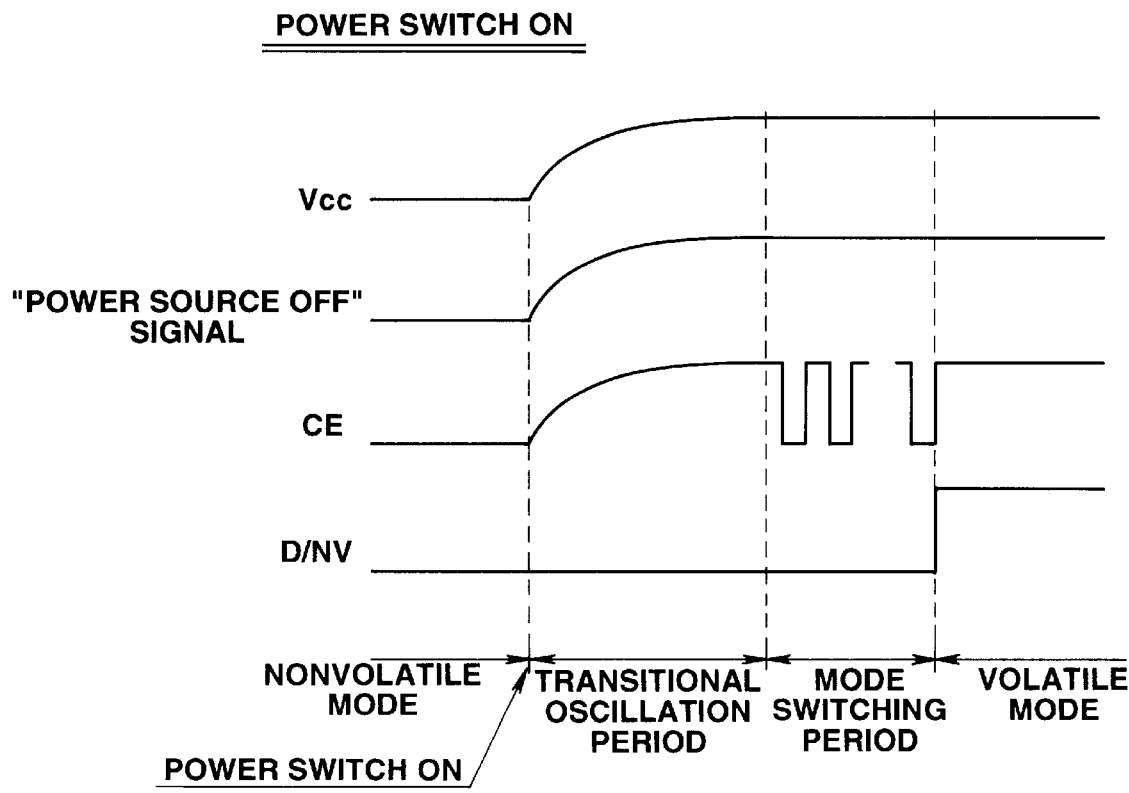

FIG. 7 is a timing chart illustrating a mode switching operation at a time when the power switch is turned on.

When the power switch SW is turned on in a state where the electronic device is in the OFF state (the ferroelectric RAM 16 is set in the nonvolatile mode), the source voltage is accumulated in the capacitor C and a signal $V_{cc}$ to be supplied to the electronic circuit 10 and the power source OFF signal gradually rise. When the signal $V_{cc}$ and the power source OFF signal becomes "1" ($V_{IH}$), the memory control circuit 17 causes a chip enable signal CE to be supplied to the ferroelectric RAM 16 for a predetermined period of time and changes a mode switching signal D/NV from "0" ($V_{IL}$) to "1" ($V_{IH}$). Thus, the ferroelectric RAM 16 is switched to the dynamic mode in which data can be written therein (recorded) or read therefrom (displayed).

Figure 8:
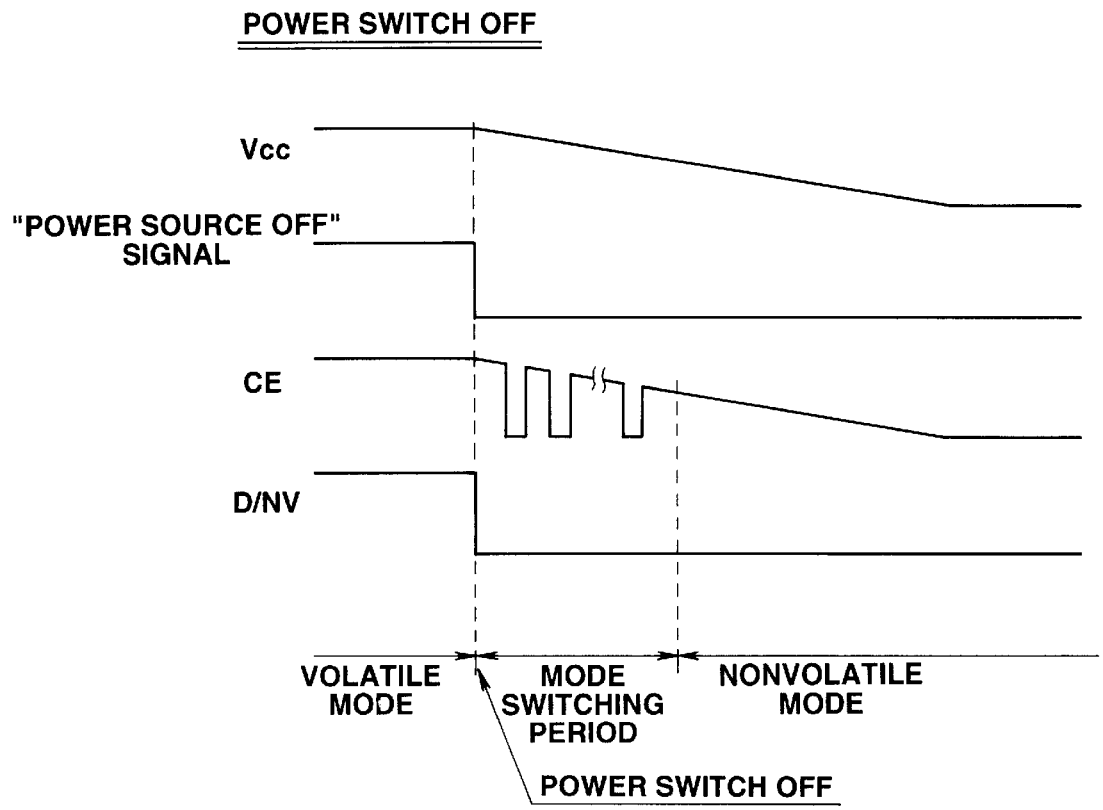
FIG. 8 is a timing chart illustrating a mode switching operation at a time when a ferroelectric RAM incorporated in the electronic circuit shown in FIG. 6 is turned off.

FIG. 8 is a timing chart illustrating a mode switching operation at a time when the power source is turned off.

When the power switch SW is turned off in a state where the electronic device is being operated (the ferroelectric RAM 16 is set in the dynamic mode), the power source OFF signal is lowered to "0" ($V_{IL}$) and the signal $V_{cc}$ is gradually lowered due to the discharge of the capacitor C. Using a residual voltage of $V_{cc}$, the memory control circuit 17 changes the mode switching signal D/NV from "1" ($V_{IH}$) to "0" ($V_{IL}$) and causes a chip enable signal CE to be supplied to the ferroelectric RAM 16 for a predetermined period of time. Thus, the ferroelectric RAM 16 is switched to the nonvolatile mode in which data can be maintained.

In the manner as described above, according to the electronic device shown in FIG. 6, the ferroelectric RAM 16 incorporated in the electronic circuit 10 is switched to the dynamic mode in which data can be written therein (recorded) or read therefrom (displayed), in association with the power ON operation, and to the nonvolatile mode in which data can be maintained, in association with the power OFF operation.

[Third Embodiment]

Figure 9:
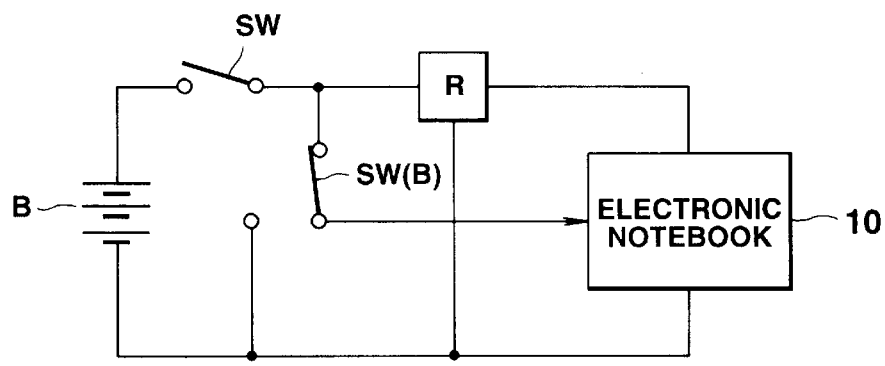
FIG. 9 is a circuit diagram showing a power supplying structure of an electronic device according to a third embodiment of the present invention.

FIG. 9 is a circuit diagram showing a power supplying circuitry of an electronic device, in which the operation mode of the ferroelectric RAM is switched in association with a battery exchange.

A source voltage is supplied from a battery source B composed of a cell or a battery to an electronic circuit 10 through a power switch SW and a constant voltage regulator R.

A battery exchange association switch SW (B) is inserted in a stage between the power switch SW and the circuit 10. When the battery B is exchanged, a battery exchange detection signal is supplied to the electronic circuit 10. The switch SW (B) operates in association with, for example, opening and closing of a battery cover, so as to be operated whenever the battery B is exchanged.

According to the electronic device shown in FIG. 9, when the battery B is exchanged the battery cover is made open and then closed to generate a battery exchange detection signal which is supplied to the electronic circuit 10. In accordance with the exchange of the battery B, the ferroelectric RAM 16 incorporated in the electronic circuit 10 is switched to the nonvolatile mode. When the exchange of the battery B is completed and the supply of the battery exchange detection signal is stopped, the ferroelectric RAM 16 is switched to the dynamic mode. Thus, the stored data cannot be lost even when the battery B is removed from the electronic device.

[Fourth Embodiment]

Figure 10:
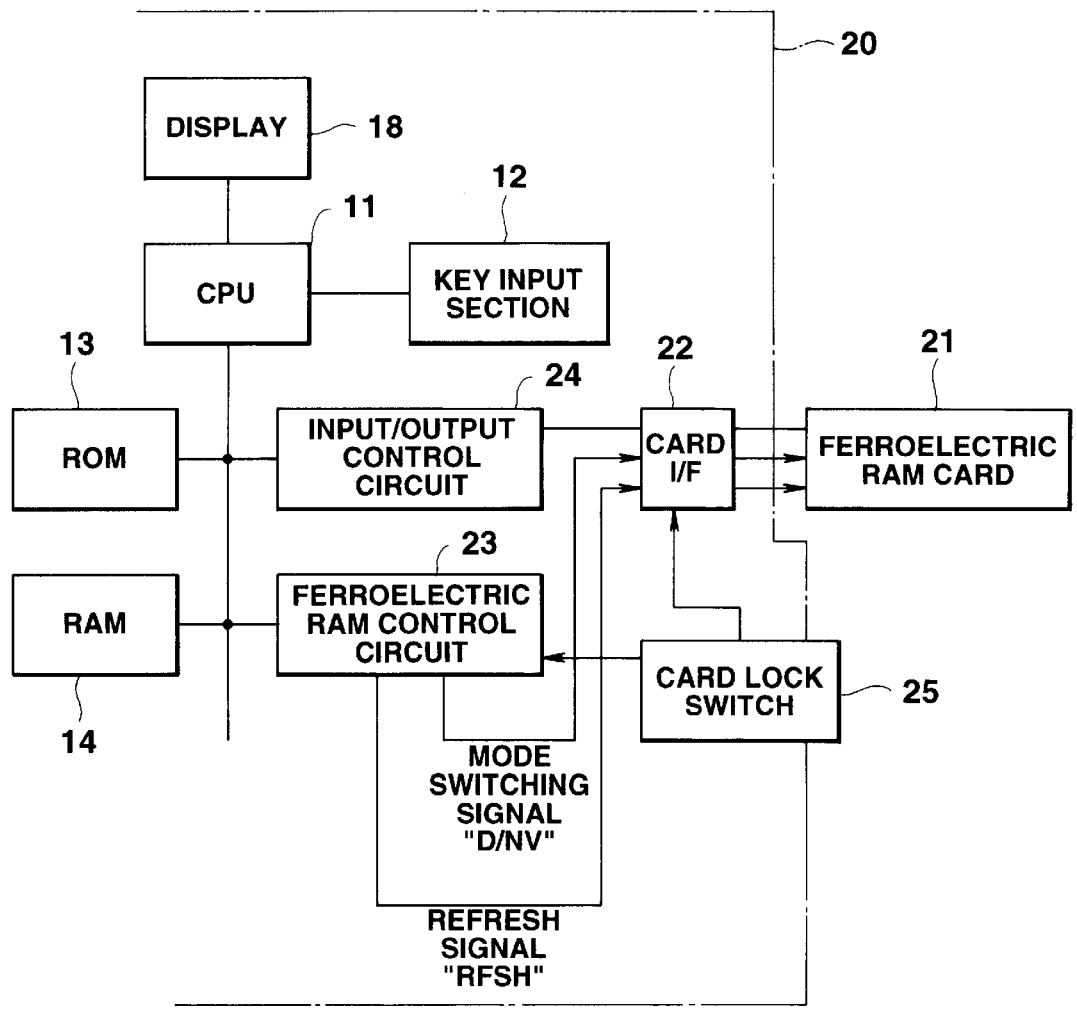
FIG. 10 is a block diagram of an electronic circuit according to a fourth embodiment of the present invention, into which a ferroelectric RAM card, serving as an external memory medium, can be inserted.

FIG. 10 is a block diagram of an electronic circuit, into which a card incorporating a ferroelectric RAM, serving as an external memory medium, can be inserted. In FIG. 10, the same elements as in the electronic circuit 10 shown in FIG. 2 are identified with the same reference numerals as used in FIG. 2, and descriptions thereof are omitted.

A ferroelectric RAM card 21 is a card-like memory medium, incorporating a ferroelectric RAM 16 similar to that of the above embodiments, for storing various data, such as schedule data and telephone number data. The ferroelectric RAM card 21 is connected to an internal circuit 20 of the electronic device through a card interface 22. The ferroelectric RAM in the card 21 switches between the dynamic mode and the nonvolatile mode in response to a signal supplied from a ferroelectric RAM control circuit 23 of the electronic device.

Data is written in (recorded) or read from (displayed) the ferroelectric RAM card 21 by the CPU 11 through an input/output control circuit 24.

A card lock switch 25 is connected to the card interface 22. When the card lock switch 25 is locked, the ferroelectric RAM card 21 inserted in the electronic device is prevented from being removed. A card lock signal output from the card lock switch 25 is supplied to the ferroelectric RAM control circuit 23.

When the card lock signal is supplied, the ferroelectric RAM control circuit 23 supplies a mode switching signal D/NV of "1" to the ferroelectric RAM incorporated in the RAM card 21 and switches the RAM to the dynamic mode in which the memory can be accessed. When the card lock signal is not supplied, as a result of the removal of the ferroelectric RAM card 21, the control circuit 23 changes the mode switching signal to "0", so that the ferroelectric RAM incorporated in the RAM card 21 is switched to the nonvolatile mode. Thus, even if the card 21 is removed from the electronic device, the data stored in the RAM card 21 can be maintained without a backup voltage.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An information storing system comprising an external memory medium and an electronic device to which the external memory medium is connectable and which writes/reads data to/from the external memory medium;

the external memory medium including a ferroelectric memory having a memory mode switching characteristic for switching between:
   a dynamic memory mode capable of writing/reading data, and
   a nonvolatile memory mode capable of holding stored data without a power supply; and the electronic device including:
   a lock switch for preventing the external memory medium from being removed from the electronic device, and
   control means for executing a control of designating the ferroelectric memory to the dynamic memory mode when said external memory medium is locked by the lock switch and for designating the ferroelectric memory to the nonvolatile memory mode when the lock switch is unlocked.

2. The information storing system according to claim 1, wherein the external memory medium has a memory card.

3. The information storing system according to claim 2, wherein the electronic device further comprises:
   a keyboard for inputting data; and
   a display panel for displaying the data.

4. The information storing system according to claim 1, wherein the control means comprise signal generating means for supplying a chip enable pulse signal (CE) and a mode switching signal (D/NV) to the ferroelectric memory, for at least a predetermined period of time, at a mode switching time.

5. An electronic device having a plurality of functions in each of which a corresponding application program is executed, comprising:
   a ferroelectric memory having a characteristic of memory mode which is switchable between:
      (i) a dynamic memory mode capable of writing/reading data, and
      (ii) a nonvolatile memory mode capable of holding stored data without a power supply;
   selection means for selecting one function from among the plurality of functions of the electronic device in response to an operation of a user;
   determining means for determining whether switching the memory mode of the ferroelectric memory is necessary or not when the one function is selected by said selection means; and
   mode control means for switching the memory mode of the ferroelectric memory when said determining means determines that the memory mode should be switched.

6. The electronic device according to claim 5, further comprising;
   a switch for turning on and off a power source of the electronic device; and
   means for designating said ferroelectric memory into the dynamic mode when the switch is operated to turn on the power source and into the nonvolatile mode when the power source is turned off.

7. The electronic device according to claim 5, wherein the mode designating means comprise signal generating means for supplying a chip enable pulse signal (CE) and a mode switching signal (D/NV) to the ferroelectric memory, for at least a predetermined period of time, at a mode switching time.

8. An electronic device according to claim 5, wherein said functions of the electronic device include at least a schedule managing function and a time keeping function;

wherein, when the time keeping function is selected by said selection means at a time when the schedule managing function is executed, the mode control means changes the memory mode of the ferroelectric memory from the dynamic mode to the nonvolatile memory mode; and wherein, when the schedule managing function is selected at a time when the time keeping function is executed, the mode control means changes the memory mode of the ferroelectric memory to the dynamic mode from the nonvolatile mode.

9. An electronic device comprising:

a ferroelectric memory having a characteristic of memory mode which is switchable between:
 (i) a dynamic memory mode capable of writing/reading data, and
 (ii) a nonvolatile memory mode capable of holding stored data without a power supply;

a switch operated at a time when a battery is taken out from the electronic device for replacing the battery with a new one, the switch operating in association with opening/closing of a battery cover provided in the electronic device; and switching means for switching the ferroelectric memory from the dynamic memory mode to the nonvolatile memory mode when said switch is detected to be operated.

* * * * *